United States Patent [19]
Toney et al.

[11] 3,827,044
[45] July 30, 1974

[54] ANALOG TO DIGITAL CONVERTER

[75] Inventors: Philip A. Toney, Maitland, Fla.; John O. Bowers, Jr., San Jose, Calif.

[73] Assignee: General Dynamics Corporation, St. Louis, Mo.

[22] Filed: Sept. 8, 1972

[21] Appl. No.: 287,391

Related U.S. Application Data

[63] Continuation of Ser. No. 42,097, June 1, 1970, abandoned.

[52] U.S. Cl. .............................. 340/347 AD, 330/17
[51] Int. Cl. .............................. H03k 13/04
[58] Field of Search .............. 340/347 AD, 347 DA; 330/17

[56] References Cited

UNITED STATES PATENTS

| | | | |
|---|---|---|---|
| 2,997,704 | 8/1961 | Gordon et al. | 340/347 AD |
| 3,124,794 | 3/1964 | Patmore | 340/347 AD |
| 3,258,765 | 6/1966 | Battjes | 340/347 DA |
| 3,290,671 | 12/1966 | Lamoureaux | 340/347 DA |
| 3,295,126 | 12/1966 | Spady | 340/347 AD |
| 3,336,589 | 8/1967 | Kaneko | 340/347 DA |
| 3,401,386 | 9/1968 | Yanishevsky | 340/347 DA |
| 3,428,908 | 2/1969 | Locanthi | 330/17 X |
| 3,452,258 | 6/1969 | Thompson | 340/347 DA X |
| 3,453,615 | 7/1969 | Scott | 340/347 AD |
| 3,474,440 | 10/1969 | Schmid | 340/347 DA |
| 3,508,249 | 4/1970 | Gordon | 340/347 DA |

*Primary Examiner*—Charles D. Miller
*Attorney, Agent, or Firm*—M. LuKacher

[57] ABSTRACT

A high speed analog to digital converter using separate weighted current sources for each digit and a null seeking comparator is disclosed. The input analog voltage is compared successively with different sums of currents developed by the current sources.

Other features include a fast-slewing input buffer amplifier with rapid response to transient loads, and extremely good regulation in the weighted current sources to keep the current constant notwithstanding temperature and load variations.

1 Claim, 7 Drawing Figures

INVENTOR.
PHILIP A. TONEY AND
JOHN O. BOWERS, JR.

BY

ATTORNEY

PATENTED JUL 30 1974

3,827,044

SHEET 2 OF 3

INVENTOR.
PHILIP A. TONEY AND
JOHN O. BOWERS, JR.

BY

ATTORNEY

INVENTOR.
PHILIP A. TONEY AND
JOHN O. BOWERS, JR.

BY

ATTORNEY

ANALOG TO DIGITAL CONVERTER

This is a continuation of application Ser. No. 42,097 filed June 1, 1970 now abandoned.

The present invention relates to analog to digital converter systems and particularly to a high-speed high-accuracy analog to digital converter.

The invention is especially suitable for use in multiplexing systems wherein input analog signals must be encoded at extremely high bit rates. An encoding bit rate of 10 MHz and higher with a resolution, say up to 12 bits, may be obtained by means of the invention. Other features of the invention will be found generally applicable in other encoding and digitizing systems.

Of the analog to digital converters which are presently available a few are capable of operating at sufficiently high speed to meet the needs of high speed multiplexing systems such as are required in pulse code modulation transmission systems for telephony and telemetry. Some encoding techniques, such as those using asynchronous serial or parallel decision techniques, provide high speed operation. Analog to digital converters of the asynchronous serial type are generally inaccurate unless operated in a tightly controlled temperature environment, and are complex. Analog to digital converters operating on a parallel basis are highly complex, especially where resolution of more than five or six bits is required. Successive approximation analog to digital converters, which have heretofore been available, are capable of high resolution and accuracy and are generally of lower complexity and cost than the parallel or asynchronous serial systems. However, such successive approximation encoders are not capable of operating at the extremely high bit rates which are now necessary to meet the needs of high-speed multiplexing systems.

Accordingly, it is an object of this invention to provide an improved analog to digital converter system which is operable at very high speed (e.g., 10MHz or higher) to digitize an input analog signal and provide a high resolution digital output in response thereto.

It is a further object of the present invention to provide an improved analog to digital converter which is extremely accurate even at high encoding speeds.

It is a still further objectof the present invention to provide an improved digital to analog converter having very fast settling time.

It is a still further object of the present invention to provide an improved high accuracy, high resolution digital to analog converter which is capable of very fast settling time.

It is a still further object of the present invention to provide improved analog to digital and digital to analog converters which are relatively uncomplicated and may be implemented in a small amount of space and at low cost.

It is a still further object of the present invention to provide an improved analog to digital converter having a wide-bandwidth, high-impedance analog input capable of tracking high slew-rate input data, and which is not materially affected by thermal and load perturbations.

Briefly described, an analog to digital converter embodying the invention includes a plurality of current sources which provide currents which are weighted with respect to each other so as to correspond in amplitude to successively higher order bits of a digital code into which an input signal is to be digitized. The encoding cycle is programmed by a sequencer which successively applies each of the currents along the first path to a comparator, which is desirably of the type which compares the difference between a voltage corresponding to the sum of the currents with the input voltage and produces an output when that voltage does not exceed ground level. When the output is produced by the comparator, switching means are actuated for diverting the current from the source which has provided the current increment through the comparator to another path. The current sources therefore are not perturbed due to load impedance changes and do not have transient modes of operation. Storage means such as a register for storing each of the bits, the values of which are determined by the comparator outputs, are provided and may be used for the dual purpose of providing switching control for diverting the current paths for current from the sources.

At the conclusion of the encoding cycle, the digital word in the storage means may be transferred to a utilization device, such as a digital multiplexer, where it may be inserted into an output serial PCM bit stream.

Another feature of the analog to digital converter is in providing the current sources in different groups. Each of the groups are operative at high level; thus avoiding a load impedance variation problem. The current sources which provide current corresponding to the lower order bits may be passed through attenuators or current division devices so that the currents which go to the comparator are properly weighted.

The invention itself, both as to its organization and method of operation, as well as additional object and advantages thereof will become more readily apparent from the reading of the following description in connection with the accompanying drawings in which.

Figure 1:
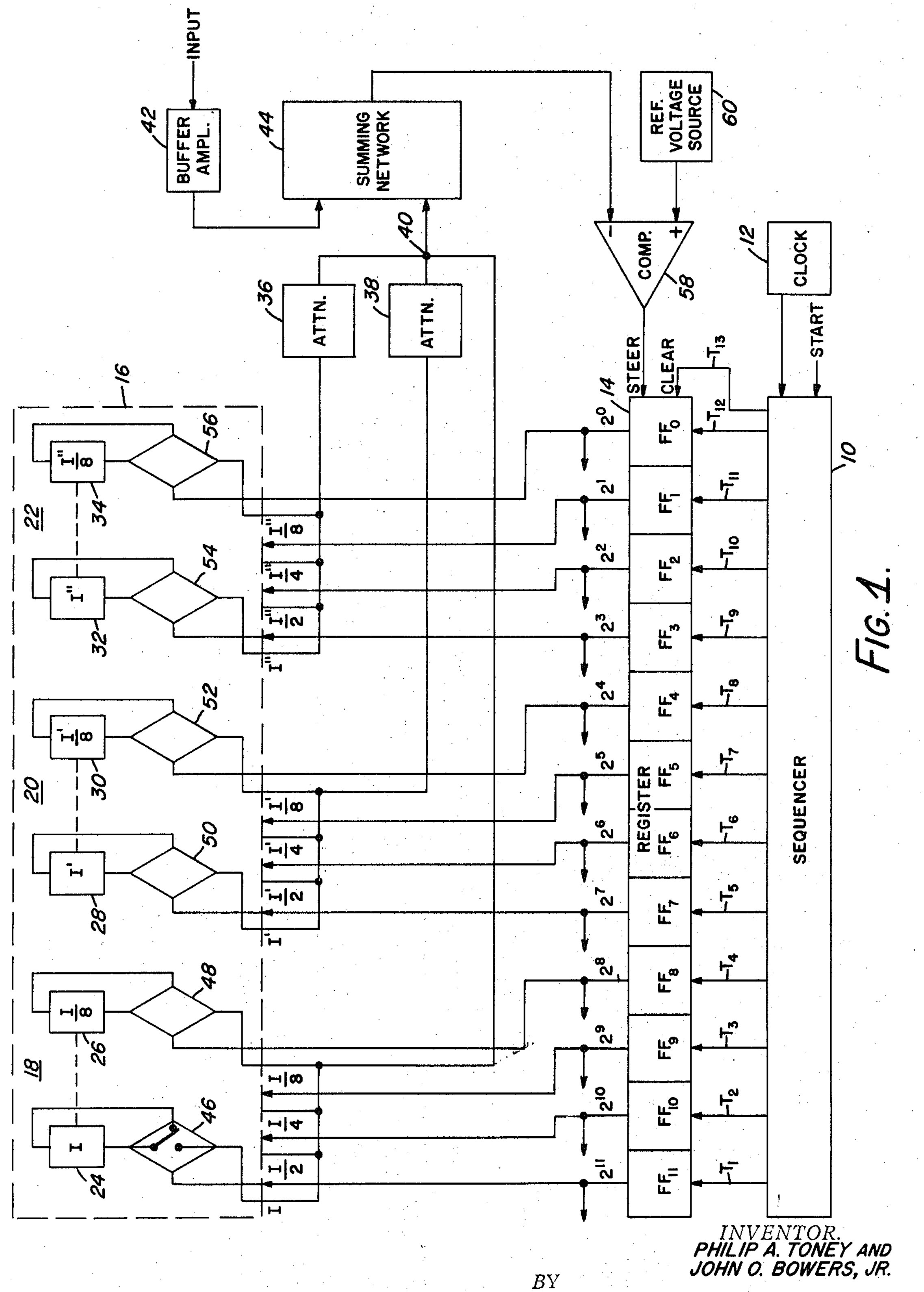
FIG. 1 is a block diagram schematically illustrating an analog to digital converter system embodying the invention.

Referring more particularly to FIG. 1. The analog to digital converter includes a sequencer 10 which provides during each encoding cycle a sequence of successive pulses $T_1$ to $T_{13}$. These pulses may be generated by suitable dividers and other logic networks in response to pulses from a crystal controlled accurate clock 12. The clock operates at the bit rate which may be for example 10 MHz. The encoding cycle is initiated by a start pulse which may be obtained from the digital multiplexer which receives the digitized output signals.

These digitized signals are obtained from a digital register 14 which performs the dual function of storing the digitized signals, indicated as the bits $2^0$ to $2^{11}$, and controlling the current generating means 16. The register itself is provided by 12 flip-flops $FF_0$ through $FF_{11}$ which are interconnected and operated in a manner which will be described hereinafter in connection with FIG. 6. The remainder of the digital portion of the system is contained in current sources which are part of the current generating means 16. Three groups of current sources are provided. One group 18 generates the current corresponding to the highest order bits, $2^8$ to $2^{11}$. The second group 20 generates currents corresponding to the intermediate bits, $2^4$ to $2^7$. The lower order bits, $2^0$ to $2^3$, have current corresponding thereto provided by the sources in the last group 22. Four current sources, the first 24 and the last 26 of which are illustrated in FIG. 1 generate currents which are weighted with respect ot each other and they are indicated as follows: I, corresponding to the highest order bit, $2^{11}$; I/2, corresponding to $2^{10}$ bit; I/4, corresponding to $2^9$ bit; and I/8, corresponding to $2^8$ bit. The four current sources in the second group (the first 28 and the last 30 of which are illustrated in detail) generate currents I' corresponding to $2^7$ bit; I'/2 corresponding to $2^6$ bit; I'/4 corresponding to $2^5$ bit; and I'/8 corresponding to $2^4$ bit. The first and last sources 32 and 34 in the last group 22 sources are also illustrated. The sources in this group generate current I'' corresponding to $2^3$ bit, I''/2 corresponding to $2^2$ bit, I''/4 corresponding to $2^1$ bit and I''/8 corresponding to $2^0$ bit.

The currents in each group are binarily related. The current levels are also desirably high (I, I' and I'' being equal to each other). In order to maintain the binary relationship between the current levels in correspondence with the relationship of the bits of the code, attenuators 36 and 38 are provided in the current paths from the groups 20 and 22. These attenuators divert sufficient current such that I' will be equal to I/16 while I'' is equal to I/256.

The currents from the various groups are combined together at a summing point 40 and applied together with the input signal which is first applied to a high input impedance, fast settling time buffer amplifier 42 into a summing network 44.

During the encoding cycle, the currents from the sources 24 through 34 are switched, each through its own gate and current path transfer diverter, which is schematically illustrated as single pole double throw switches 46, 48, 50, 52, 54 and 56. Gate control pulses and levels are provided to these switches 46 through 56 (of course, separate switches are provided for each of the current sources in each of the groups which are not shown) from the correspondingly ordered flip-flop stages of the register 14. When the flip-flop stores a zero bit, switches are in the position shown for the switch 46 in FIG. 1 and current is diverted from the current source around a path separate from the path which leads to the summing point 40 and the summing network 44. When a one bit is stored in a flip-flop its corresponding switch is operated and the current flows into the summing network. The constant current sources are therefore not perturbed or permitted to saturate. Transient problems are also avoided. For example, if the current switch were merely opened, a transient response would be interposed and the settling time of the converter for digitization of each bit would have to be increased. The current diverting feature provided by the invention therefore increases the encoding speed of the converter.

The fact that the current sources also operate at high level minimizes settling time due to variations in load impedance as the current sources are switched into the summing network (e.g., stray capacitance charge and discharge is achieved very rapidly at the high current levels used).

The output of the summing network is applied to a comparator 58. The comparator compares the output of the summing network with a reference voltage from a source 60. Desirably this source is at or substantially at ground level, inasmuch as when the magnitude of the output due to the current sources is equal to the value of the input sample, the output of the summing network 44 is a null or essentially ground level. The comparator output is applied to a steering input of the flip-flop. If the comparator output is high, it indicates that the contribution of the analog signal at the summing network is below that due to the particular current source; thus the flip-flop whose output operates the switch which permits a current to flow out of the summing network is reset at the end of the bit period. When the bits corresponding to each of the current sources have had their values determined the digitized output code may be transferred, say by a suitable transfer pulse generated in the sequencer, to the utilization device. Then the last pulse $T_{13}$ is operative to clear the register in preparation for starting the next encoding cycle.

Figures 6, 7:
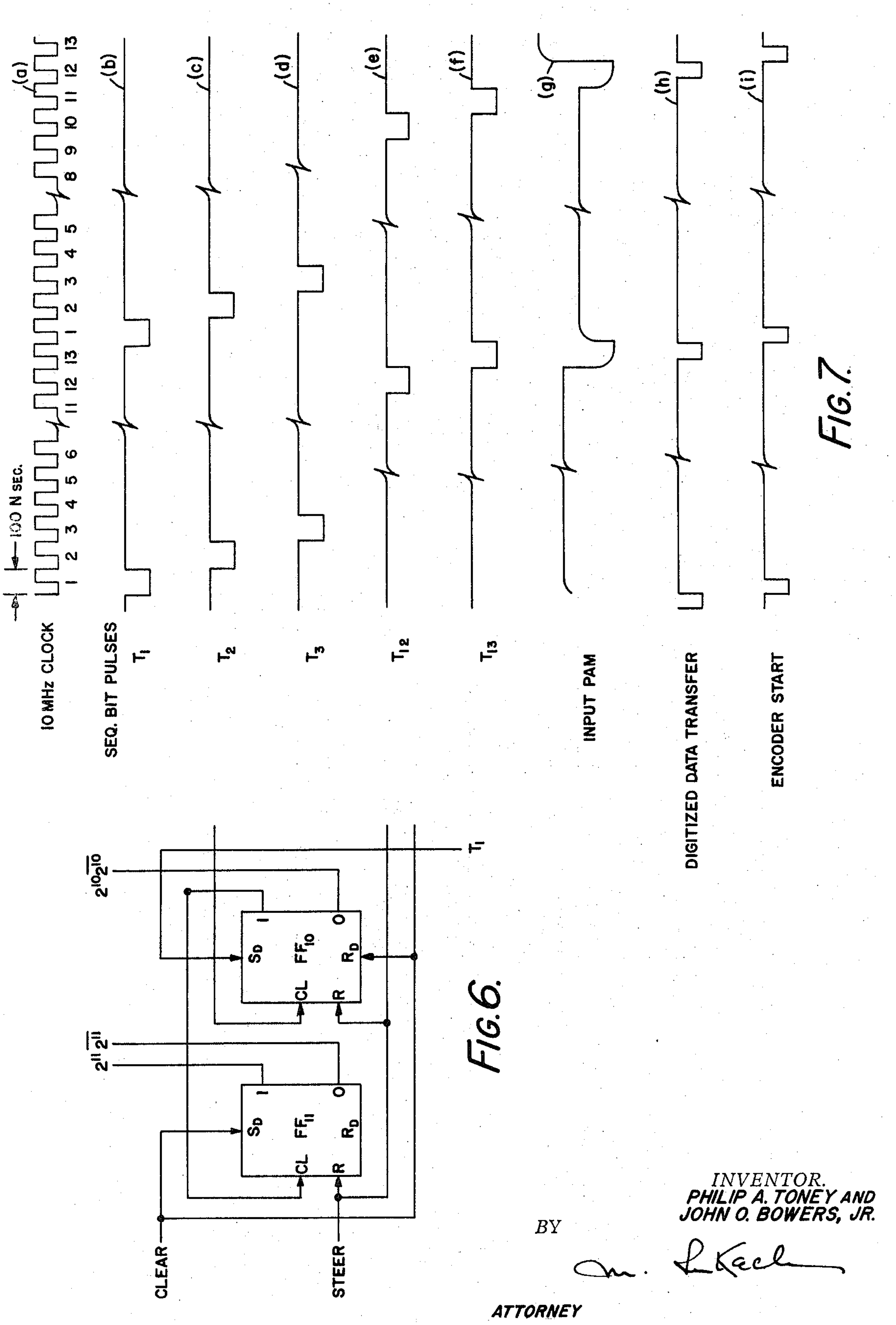
FIG. 6 is a partial block diagram of the storage register which is used for controlling current from the sources as well as storing the output bits into which the analog input signal is encoded.
FIG. 7 is a series of wave forms indicating the timing of operations in the analog to digital converter shown in FIG. 1.

The sequence of operation during the encoding cycle is also illustrated in the wave form of FIG. 7. Waveform (*a*) illustrates the clock output. The timing pulses $T_1$ to $T_{13}$ produced by the sequencer 10 are also shown in waveforms (*b*) to (*f*). The input PAM sample which of course is held during each encoding cycle (viz, 12 clock pulses) and updated on the 13th clock pulse is shown in waveform (*g*). Transfer of the digital data is provided by the transfer pulse waveform (*h*) which may for example operate gates (not shown) coupled to the outputs of the flip-flop in the register 14. The start pulse occurs just before the first clock pulse as indicated in waveform (*i*). Each of the sequential pulses $T_1$ through $T_{12}$ also clocks the flip-flop stage in the register to which it is connected, so that it may be reset by the steering input from the comparator 58. The start pulse or the clear pulse may be operative to set the first flip-flop $FF_{11}$ (viz, set the most significant bit in the register to "1"). At the conclusion of the first bit period, the period of $T_1$, the comparator 58 provides an output steering pulse if the most significant bit flip-flop $FF_{11}$ is to be reset to zero. Similarly at the beginning of each bit period, the timing pulses preset the successive flip-flops to "1" and they are reset if the analog output developed by the current sources exceeds the amplitude of the input PAM sample, In this way, the various flip-flop stages are set or reset and store the digital code corresponding to the amplitude of the analog sample.

Figures 2, 3, 4, 5:
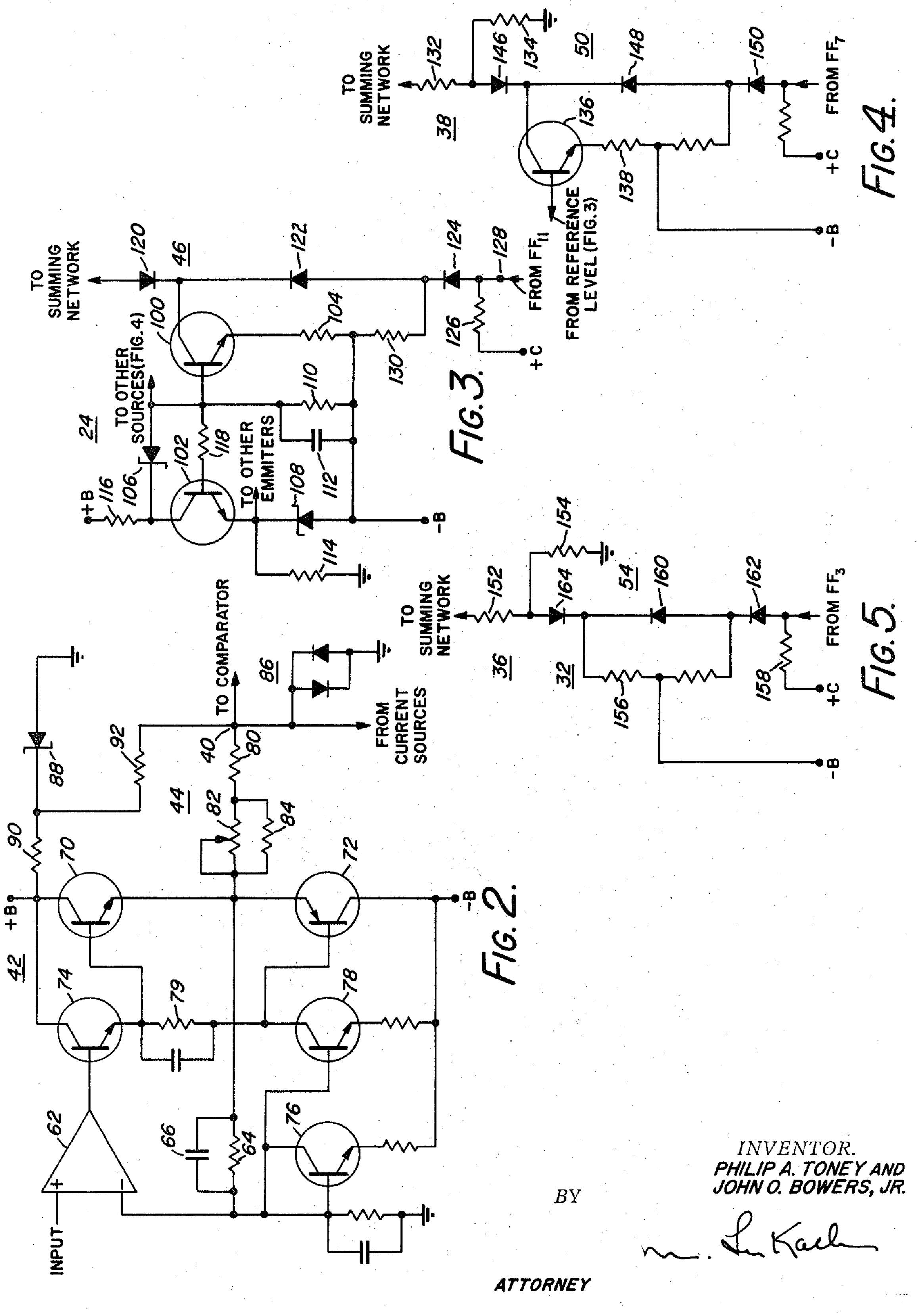
FIG. 2 is a schematic diagram of the input buffer amplifier and summing network of the system shown in FIG. 1.
FIG. 3 is a schematic diagram of a current source characteristic of the sources in one group of current sources which are shown in FIG. 1.
FIGS. 4 and 5 are schematic diagrams which are characteristic of other current sources in other groups of current sources which are shown in FIG. 1.

The input buffer amplifier 42 and the summing network 44 are shown in FIG. 2. The input PAM sample is applied to the direct input of a differential amplifier stage which may be an operational type amplifier 62. Desirably, this amplifier is of a long tail pair configuration having current sources for providing collector and emitter currents, such that all of the voltage gain is concentrated in the first stage. Provision of only one voltage gain stage, inherently limits amplifier roll-off to no more than 6db/octave, which renders it unconditionally stable, without need for large frequency compensation components and their attendant reduction in bandwidth and slew rate. The resulting amplifier thus achieves differential amplifier precision, high input impedance and high slew rate. The use of a pair of current sources in the collector and emitter circuit of the amplifier 62 also contributes significantly to increasing its open-loop gain and supply voltage rejection and is therefore preferred.

Feedback is provided by a feedback resistor 64 connected to the inverting input. This feedback resistor may be shunted by a capacitor 66 to improve amplifier transient response. Feedback is obtained from a pair of transistors 70 and 72 which are of complementary symmetry configuration, their emitters being connected together at a common point which is the point at which a feedback to the first stage 62 is derived. An emitter follower stage 74 drives the transistor 70. The current for this stage is controlled by a constant current source provided by a circuit including a pair of transistors 76 and 78. Diode-connected transistor 76 compensates any variations in base-emitter voltage of transistor 78 and insures the operating point of this transistor 78 remains stable notwithstanding temperature or load variations. The current provided by transistor 78 flows through the resistor 79 connecting the bases of 70 and 72, which arrangement provides reduced crossover distortion than the common diode biasing method. The capacitor across this resistor improves amplifier transient load response.

The summing network 44 is provided by a pair of precision resistors 80 and 82, the resistor 82 being a potentiometer resistor for gain adjustment purposes. In other words, by adjusting (in creasing) the value of the resistor 82 the effective gain of the input buffer is decreased thereby allowing the converter to handle higher amplitude input PAM samples. Additional gain control, if required, may be provided by a resistor 84 which shunts the potentiometer resistor 82.

Momentarily omitting clamping diodes 86 from consideration, the amplified analog sample voltage initially appears at the summing point 40 without substantial attenuation, since very little current is drawn from the complementary symmetry stage including the transistors 70 and 72. Increments of constant current due to flow through each of the current sources take place through the summing network, and voltages are developed across the resistors 82, 84 and 80 which are applied to the comparator. It will be observed that the polarities of the voltages with respect to ground at the summing point 40 due to the input PAM sample are in opposite sense to the voltage developed at that point due to the current flow through the current sources. Thus if the current from the sources provides a voltage equal to the analog voltage sample, a null or substantially ground potential will be applied to the comparator input. The pair of clamping diodes 86 is provided to increase the encoding speed by preventing excessive voltage excursions at the summing point with respect to ground.

In the event that bi-polar inputs are to be digitized, an offset current is provided by a circuit including a precision zener diode 88 and a pair of resistors 90 and 92. Resistor 90 provides the correct bias current to zener diode 88 from the source of operating voltage at +B. (The other operating voltage source is of course indicated at −B.) Resistor 92 is a precision resistor whose voltage drop approaches a constant value as the analog to digital conversion process approaches the lowest-order bit decision. Therefore, it supplies an offset current to the summing point which is a constant at the completion of the encoding process, irrespective of the value of analog input voltage applied, the net effect of which is to shift the input voltage range so that bipolar inputs are also accepted.

The current source 24 and its associated switching or transfer gates 46 are shown by way of illustration of all of the current sources and switches in the group 18 (see FIG. 3). The current source itself includes a pair of transistors 100 and 102. Constant current flows at all times through the transistor 100 and its constancy is regulated by the transistor 102. The level of this constant current is maintained by the precision level controlling resistor 104 in the emitter path of the transistor 100. It will be appreciated that the values of all of the resistors in the current sources 24 to 26 in the group 18 are binarily related (viz, if resistor 104 had a value of R the remaining three current determining resistors would have values 2R, 4R and 8R). The temperature stability of the current source is achieved through use of $h_{fe}$ and $\Delta V_{BE}$ tracking of transistors 100 and 102, and precision zener diode 108. Resistor 116 and feedback zener diode 106 are chosen so that the operating point current of transistor 102 is self-regulated to very nearly the operating point current of transistor 100, notwithstanding temperature variations. Resistor 118, which is nominally equal in value to resistor 104, compensates for temperature variations in the collector current of transistor 100, that is, the current supplied to the summing point, due to $h_{fe}$ changes in the transistors. Bias resistor 110, which is shunted by a capacitor 112 for transient response improvement purposes is provided to properly bias zener diode 106. Precision zener diode 108 develops a reference voltage which is accurately imposed across precision resistor 104, since the base-emitter voltage drops of transistors 100 and 102 track and cancel at all temperatures. The same zener diode 108 may be used to furnish all of the bias voltages in all of the current sources in the groups 18. Resistor 114 adjusts the bias current through zener diode 108 to minimize its temperature coefficient. The collector current of transistor 100 is thus accurately maintained, in spite of load or temperature variations, by means of the several associated circuit elements just described.

The transfer gates are provided by a pair of diodes 120 and 122. Current switching is controlled by the output of the flip-flop ($FF_{11}$ in the case of the circuit illustrated in FIG. 3, which is applied to the switching network of diodes 120 and 122 by way of another diode 124). The diodes 124 and 122 are normally biased in the forward direction by voltage from a source of operating voltage indicated as +C which is applied to the diode 124 by way of a resistor 126. When the flip-flop $FF_{11}$ is set, a negative voltage is applied at the terminal 128 thereby reverse biasing the diode 122 and opening the diverting or shunting path around the transistor 100. In other words, a negative output level from the flip-flop corresponds to a binary "1." When the flip-flop is reset to binary "0" the voltage therefrom at terminal 128 is somewhat positive: thus the operating voltage from the source indicated as +C forward biases the diodes 124 and 122 and reverse biases the diode 120, thereby preventing current from flowing through the diode 120 into the constant current source. The current is then supplied from the diverting path (through diodes 122 and 124 and resistor 126).

The constant current source 28 which is representative of the constant current sources in the group 20 is shown in FIG. 4. This source may be much simpler than the source shown in FIG. 3 since the current levels which is produced are substantially attenuated by means of the attenuator 38 which includes a pair of resistors 132 and 134. The source itself includes a transistor 136 having a current determining resistor 138 in its emitter circuit. The base voltage and operating point is kept constant so as to maintain the constancy of current by connecting its base to the controlled reference voltage at the base of transistor 100 in the highest order constant current source in the group 18. The switching circuit 50 operates in a manner identical to that described in FIG. 3 in connection with the switching circuit 46. It includes diode 146 for interrupting current through the summing network and a diverting diode 148 which is switched via a diode 150 by the output from $FF_7$.

FIG. 5 illustrates that the current source for the group of current sources which provide the lowest order bits may be still simpler by virtue of the considerable attenuation provided by the network 36. This network also consists of a pair of resistors 152 and 154. The current determining resistor 156 of the source 32 which is illustrative of the sources of the group 22 is also connected so that current therethrough may be shunted in a diverting path established by a resistor 158 and diodes 160 and 162, when these diodes are forward biased by operating voltage from the source +C via the control input from $FF_3$. When the flip-flop $FF_3$ registers a binary "1" bit, the diode 160 is reverse biased and the diode 164 which controls passage of current into the summing network is forward biased.

The interconnection of the flip-flop stages $FF_{10}$ and $FF_{11}$ for the two highest order bits is shown in FIG. 6. These flip-flops may be of the type provided in the TTL family of logic elements which are available in integrated circuit form. Both flip-flops may be one integrated circuit. It will be observed that the clock input for the first flip-flop is obtained from the 1 output of the second flip-flop $FF_{10}$, thus utilizing the delay in $FF_{10}$ resulting when the second flip-flop is preset by the $T_1$ timing pulse from the sequencer to insure that the higher order flip-flop $FF_{11}$ can only be clocked and reset by means of the steering inputs applied to all reset terminals after the requisite time for comparator operation has elapsed. The clear pulse is applied to the direct set input of $FF_{11}$, and to the direct reset input of all other flip-flops. This feature, which presets flip-flop $FF_{11}$ to the "1" state upon occurrence of the clear pulse, insures that the analog to digital converter is ready for operation when the next start pulse arrives.

From the foregoing description it will be apparent that there has been provided an improved high speed analog to digital converter having features of structure and operation which achieve such high speed operation as a 10 MHz or higher encoding rate. While circuits have been illustrated which may be embodied in a preferred form of the converter system, variations and modifications therein as well as other aspects of the system itself, within the scope of the invention may suggest themselves to those skilled in the art. Accordingly, the foregoing description should be taken merely as illustrative and not in any limiting sense.

What is claimed is:

1. An analog to digital converter system which comprises:

a. means for generating a plurality of high level currents, each weighted with respect to the other so as to correspond in amplitude to successively higher order bits of a plurality of bits of a digital code, b. comparing means for providing outputs when the analog input signal to be converted into digital form does not exceed a signal corresponding to the current generated by said generating means, c. a plurality of groups of switching means for successively applying the said currents from said generating means along a plurality of first paths, groups of which first paths join to form a plurality of second paths which in turn form a common path to said comparing means, d. said switching means including means in each of said first paths for diverting each of said currents to closed circuit paths different from said plurality of first paths in response to said outputs, e. means responsive to said outputs and included in said generating means for successively storing the bits of said code corresponding to each of said currents, f. separate attenuating means in at least one of said plurality of second paths for attenuating the current flowing from said second path to said common path to relatively low level, and g. said generating means comprising a plurality of current sources, said current sources comprising a first transistor having a resistor for determining the level of current in said first path in the emitter circuit thereof, said first transistor being connected in series with said first path, a second transistor circuit for maintaining said current level constant and said second transistor circuit including a resistor connected to the collector of said second transistor, a zener diode connected between said second transistor collector and said first transistor base and polarized in a direction consistent with that of the second transistor collector voltage, a bias determining resistor connected to the base of said first transistor, zener diode connected to the emitter of said second transistor for maintaining the potential applied to said first transistor emitter resistor constant, and a resistor connected between the bases of said first and second transistors.

* * * * *